(12) United States Patent
Shishido et al.

(10) Patent No.: US 6,929,892 B2
(45) Date of Patent: Aug. 16, 2005

(54) METHOD OF MONITORING AN EXPOSURE PROCESS

(75) Inventors: Chie Shishido, Yokohama (JP); Hidetoshi Morokuma, Hitachinaka (JP); Yuki Ojima, Hitachinaka (JP); Maki Tanaka, Yokohama (JP); Wataru Nagatomo, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/894,044

(22) Filed: Jul. 20, 2004

(65) Prior Publication Data

US 2005/0037271 A1 Feb. 17, 2005

(30) Foreign Application Priority Data

Aug. 12, 2003 (JP) ........................................ 2003-207252

(51) Int. Cl.$^7$ .............................. G03C 5/00; G03F 9/00
(52) U.S. Cl. ........................ 430/30; 430/296; 430/942; 250/307; 250/310; 250/311
(58) Field of Search .......................... 430/30, 296, 942; 250/307, 310, 311

(56) References Cited

U.S. PATENT DOCUMENTS 6,791,082 B2 * 9/2004 Komuro et al. ............. 250/307

FOREIGN PATENT DOCUMENTS

| JP | 11-288879 | 10/1999 |
|----|-----------|---------|
| JP | 2003-59813 | 2/2003 |
| JP | 2003-173948 | 6/2003 |
| JP | 2003-243291 | 8/2003 |

OTHER PUBLICATIONS

"Electron Beam Testing Handbook", p. 255, research material for industrial application of charged particle beam at 98$^{th}$ meeting of 132$^{nd}$ committee of Japanese Society for the promotion of Science.

* cited by examiner

Primary Examiner—Christopher G. Young
(74) Attorney, Agent, or Firm—Antonelli, Terry, Stout & Kraus, LLP

(57) ABSTRACT

In monitoring of an exposure process, a highly isolative pattern greatly changed in a shape of cross section by fluctuations in the exposure dose and the focal position is an observation target. Especially, to detect a change in a resist shape of cross section from a tapered profile to an inverse tapered profile, one of the following observation methods is employed to obtain observation data: (1) a tilt image of a resist pattern is imaged by using tilt imaging electron microscopy, (2) an electron beam image of a resist pattern is imaged under imaging conditions for generating asymmetry on an electron beam signal waveform, and (3) scattering characteristic data of a resist pattern is obtained by an optical measurement system. The observation data is applied to model data created beforehand in accordance with the exposure conditions to estimate fluctuations in the exposure dose and the focal position.

15 Claims, 13 Drawing Sheets

E: EXPOSURE DOSE
F: FOCUS
$f_k$: k-TH FEATURE AMOUNT VALUE
$M_k(E, F)$: MODEL VALUE IN k-TH FEATURE AMOUNT (E, F)
BUT, k=1 ... n (n IS TOTAL NUMBER OF FEATURE AMOUNTS)

$W_1$: BOTTOM WIDTH OF RESIST PATTERN
$\theta$ : TILT ANGLE OF RESIST PATTERN
$W_2$: WIDTH OF FILM PATTERN

SECTION TO BE MEASURED

SECONDARY ELECTRON SIGNAL WAVEFORM $f_1$: PATTERN WIDTH

SMALL — LARGE FOCUS
BEST FOCUS $f_1$: PATTERN WIDTH

EXPOSURE DOSE
BEST EXPOSURE DOSE $f_2$: WHITE BAND WIDTH

SMALL — LARGE FOCUS
BEST FOCUS $f_2$: WHITE BAND WIDTH

EXPOSURE DOSE
BEST EXPOSURE DOSE

FIG. 7A

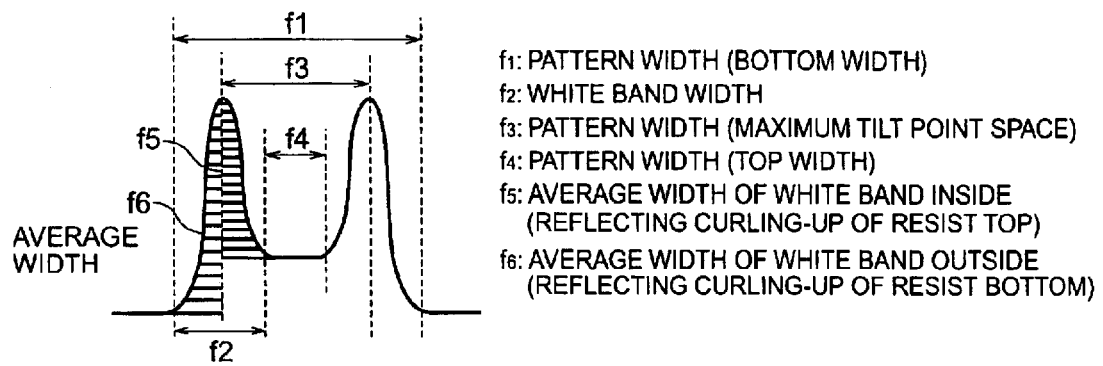

f1: PATTERN WIDTH (BOTTOM WIDTH)
f2: WHITE BAND WIDTH
f3: PATTERN WIDTH (MAXIMUM TILT POINT SPACE)
f4: PATTERN WIDTH (TOP WIDTH)
f5: AVERAGE WIDTH OF WHITE BAND INSIDE
    (REFLECTING CURLING-UP OF RESIST TOP)
f6: AVERAGE WIDTH OF WHITE BAND OUTSIDE
    (REFLECTING CURLING-UP OF RESIST BOTTOM)

FIG. 7B

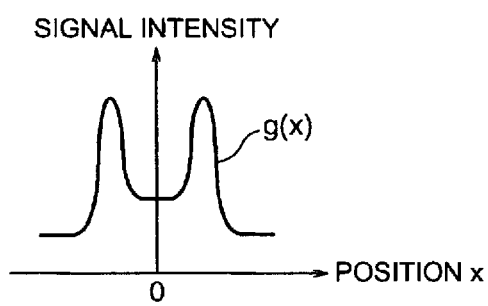

FIG. 7C

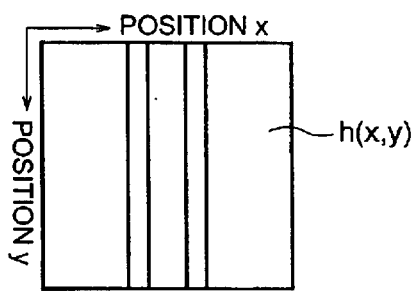

FIG. 7D

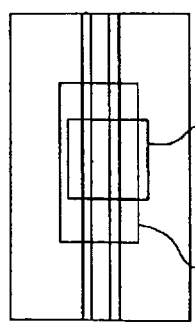

IMAGE ACQUISITION RANGE AT TIME OF EQUAL LENGTH AND BREADTH MAGNIFICATION

IMAGE ACQUISITION RANGE AT TIME OF VARIABLE LENGTH AND BREADTH MAGNIFICATION (DOUBLE FOR LENGTH)

FIG. 8A
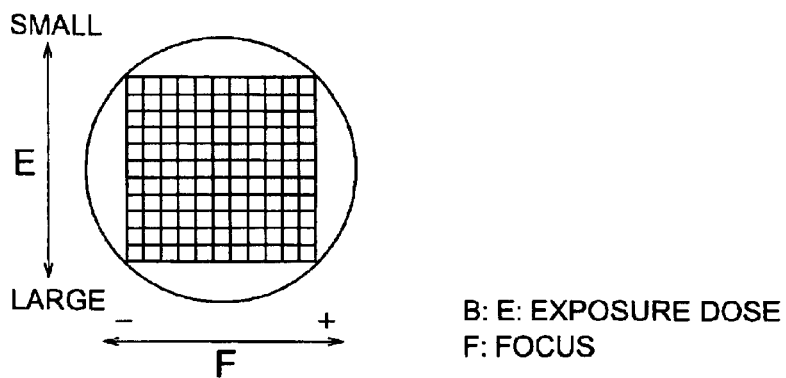
B: E: EXPOSURE DOSE
F: FOCUS
FIG. 8B
ORIGINAL DATA  $m_k(E,F)$
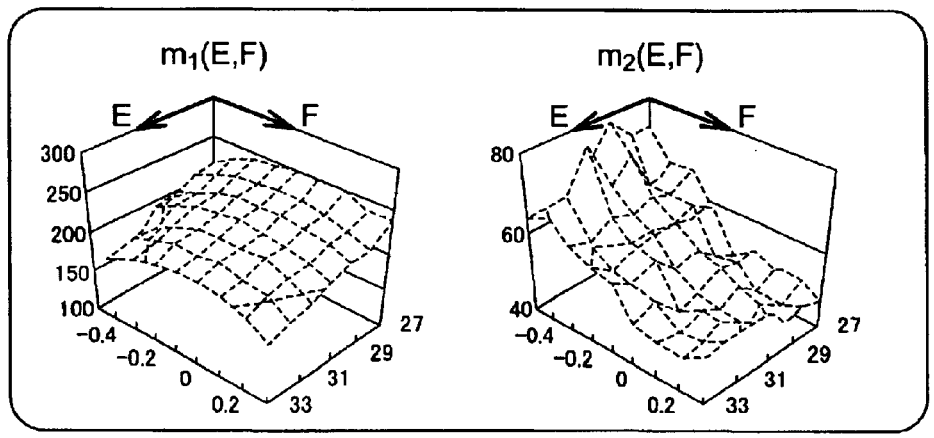
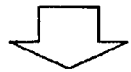
FIG. 8C
MODEL DATA  $m_k(E,F)$
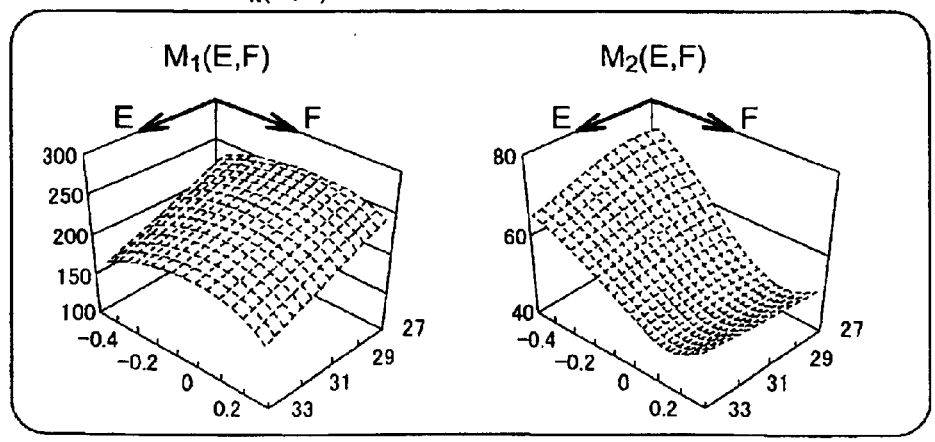

FIG. 9A
APPLICATION OF FEATURE AMOUNT
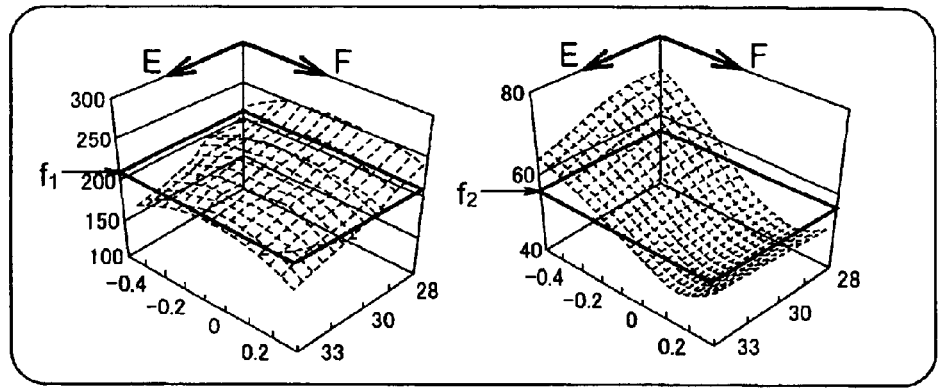
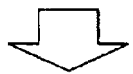
FIG. 9B
LIKELIHOOD FUNCTION $p_k(E,F)$
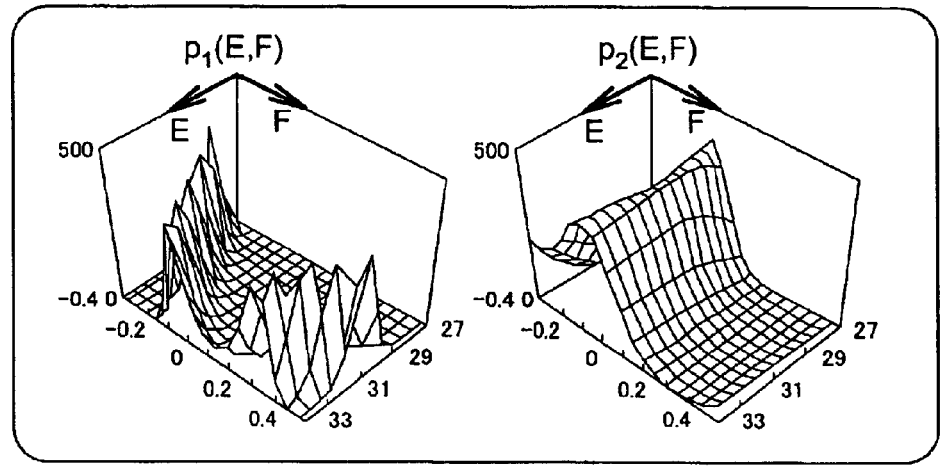
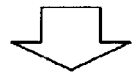
FIG. 9C
PRODUCT OF LIKELIHOOD FUNCTION $P(E,F)$
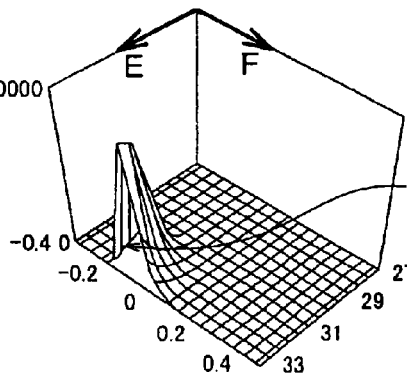
RESULT OF ESTIMATION (E,F)

METHOD OF MONITORING AN EXPOSURE PROCESS

INCORPORATION BY REFERENCE

The present application claims priority from Japenese application JP2003-207252 filed on Aug. 12, 2003, the content of which is hereby incorporated by reference into this application.

BACKGROUND OF THE INVENTION

The present invention relates to an exposure process for forming a resist pattern by exposing and developing a resist film deposited on a wafer in a manufacturing process of a semiconductor device, and more particularly to an exposure process monitoring method suited for controlling the exposure process.

FIG. 2 shows a flow of a conventional lithography process.

A resist pattern is formed by applying a resist which is a photosensitive material on a substrate such as a semiconductor wafer with a predetermined thickness, reducing and exposing a mask pattern by using an exposure tool (2050), and then developing the mask pattern (2051). The formed resist pattern is subjected to dimension checking by scanning electron microscopy (critical dimension-scanning electron microscopy or CD-SEM) equipped with a dimension measuring function (2052).

A conventional processing procedure by use of the critical dimension-scanning electron microscopy comprises, for example, acquiring an electron beam image of a region containing sites in which dimension accuracy is strictly controlled (2053), measuring the dimension (2054), deciding whether or not the dimension satisfies standards (2055), and then altering an exposure dose of an exposure tool if it is not satisfied (2056, a correction dose of the exposure dose is ΔE). For example, in the case of a positive type resist, if a resist dimension is too large, the exposure dose is increased, and if a resist width is too small, the exposure dose is decreased. The exposure dose to be increased or decreased is often determined on the basis of experience and hunch of an operator.

FIG. 3 shows a relation between a resist pattern and a film pattern after etching (p. 255 "ELECTRON BEAM TESTING HANDBOOK", research material for industrial application of charged particle beam at 98 th meeting of 132 nd committee of Japan Society for the Promotion of Science). There is a certain relation between a shape of the resist pattern and a shape of the film pattern after the etching if etching conditions are similar. The resist pattern must have a predetermined shape to obtain a film pattern of a predetermined shape.

At the time of starting manufacturing of a semiconductor substrate of a new type or the like, before a product wafer is fed, a wafer is prepared in which a pattern is baked by changing a focal position and an exposure for each shot (exposure unit for one round) (such a wafer is normally called a focus & exposure matrix wafer (FEM wafer)), and dimensions of a resist pattern of each shot are measured. In addition, "condition finding work" is carried out to find a focal position and an exposure dose which enable acquisition of a predetermined resist pattern shape by cutting the wafer to investigate its shape of cross section or the like. By this work, a best exposure dose and a best focal position are decided, and the product wafer is subjected to exposure under such conditions.

With time, however, various process fluctuations (drifting of various sensors of the exposure tool, a change in photosensitivity of the resist, a variance in post exposure bake (PEB) temperature or the like) may occur to disable acquisition of a resist pattern of a proper shape under the conditions decided by the condition finding work. It is a role of the aforementioned dimension measurement (step 2052) that detects such disability. According to a conventional technology, compensation has been tried for process fluctuations by using the dimensions as a barometer thereof and correcting the exposure dose. Japanese Patent Application Laid-Open No. 11-288879 is available as a document regarding the conventional technology.

According to the conventional technology, to detect and counter process fluctuations, a method has been employed to investigate a dimension value of a line width or the like by using the CD-SEM, and to correct an exposure dose if the dimension value does not satisfy a standard.

However, recent micronization of semi-conductor patterns has been accompanied by very small fluctuation permissible amounts of the exposure dose and the focal position, creating a situation in which it is difficult to maintain the process within a proper range only by correcting the exposure dose. For example, it is now required to control an exposure dose fluctuation to 8 to 10% or lower, and a focal position fluctuation to 200 to 300 nm or lower at a node of 65 nm. To realize this control, information quantitatively indicating the process fluctuations, i.e., fluctuation amounts: deviation m joules of the exposure dose and deviation nm of the focal position, must be accurately quantified.

In the conventional technology, the fluctuation of the focal position may be overlooked (∵ fluctuation of focal position is not always accompanied by dimension fluctuation), and detection of exposure dose deviation is far from accurate (∵ dimension fluctuation may occur due to deviation of focal position). Further, even when the focal position should originally be corrected, the exposure dose is corrected, and thus there is apparently a case that a resist pattern of a proper shape cannot be obtained. Therefore, it is impossible to maintain the proper exposure process by the conventional technology.

These and other objects, features and advantages of the invention will be apparent from the following more particular description of preferred embodiments of the invention, as illustrated in the accompanying drawings.

SUMMARY OF THE INVENTION

The present invention relates to a method of monitoring an exposure process which can maintain a proper exposure process, and more particularly to a method of monitoring an exposure process which can measure not only a fluctuation of an exposure dose but also an accurate fluctuation amount of a focal position.

That is, the present invention comprises the following steps:

[Step 1]: To begin with, observation data of a resist pattern under various exposure conditions is obtained.

[Step 2]: Model data for correlating the exposure conditions with the observation data is created by using the obtained observation data.

[Step 3]: Observation data of a resist pattern formed through the exposure process to be monitored is obtained.

[Step 4]: The observation data is collated with the model data to estimate a deviation amount of the exposure process to be monitored from proper conditions.

According to the invention, a resist pattern changed in dimensions and in a shape of cross section from a tapered profile to an inverse tapered profile by a fluctuation in the exposure conditions is an observation target, electron microscopy which enables tilt imaging is used as observation means in the steps 1 and 3, and electron beam images and/or dimension feature amounts which contain edge widths and/or pattern widths of electron beam images of resist patterns obtained by the tilt imaging are used as the observation data.

According to the invention, a resist pattern changed in dimensions and in a shape of cross section from a tapered profile to an inverse tapered profile by a fluctuation in the exposure conditions is an observation target, electron microscopy is used as observation means in the steps 1 and 3, and electron beam images and/or dimension feature amounts which contain edge widths and/or pattern widths of electron beam images of resist patterns imaged under imaging conditions for generating asymmetry on a signal waveform in accordance with a shape of cross section of the resist pattern are used as the observation data.

Furthermore, according to the invention, a resist pattern changed in dimensions and in a shape of cross section from a tapered profile to an inverse tapered profile by a fluctuation in the exposure conditions is an observation target, an optical measurement system which detects a scattered light from the resist pattern is used as observation means in the steps 1 and 3, and scattering characteristic data is used as the observation data.

Other objects, features and advantages of the invention will become apparent from the following description of the embodiments of the invention taken in conjunction with the accompanying drawings.

BRIEF DESCRIPTION OF THE DRAWINGS

FIG. 7A is a view showing the secondary electron signal waveform and a feature amount of the isolated line pattern;

FIG. 7B is a view showing a normalization state of the secondary electron signal waveform;

FIG. 7C is a plan view of the isolated line pattern;

FIG. 7D is a plan view of the isolated line pattern showing an image acquisition range;

FIG. 8A is a plan view of an FEM wafer;

FIG. 8B is a 3-dimensional graph showing original data;

FIG. 8C is a 3-dimensional graph showing model data;

FIG. 9A is a view showing a method of applying a feature amount $f_k$ to the model data;

FIG. 9B is a graph showing a likelihood function Pk (E, F);

FIG. 9C is a graph showing a product P (E, F) of the likelihood function;

DESCRIPTION OF THE EMBODIMENTS

Next, the preferred embodiments of the present invention will be described with reference to the accompanying drawings.

(1) Overall Flow

Figure 1:
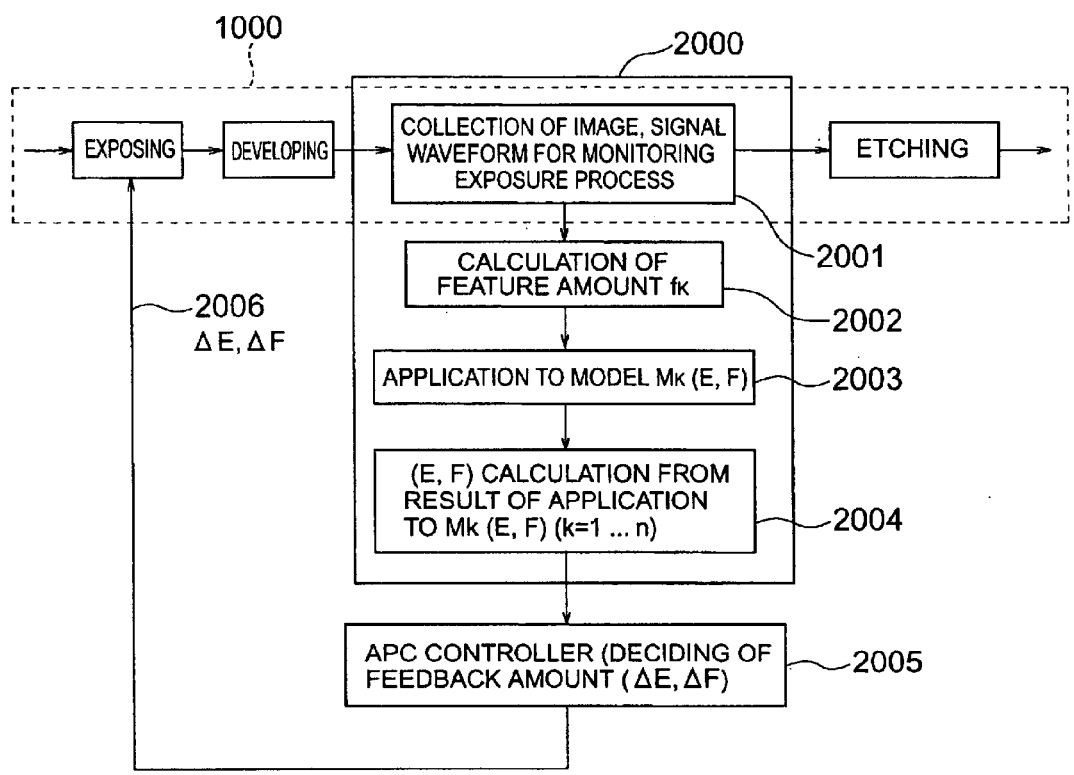
FIG. 1 is a block diagram showing an entire constitution of a method of monitoring an exposure process.
Figure 2:
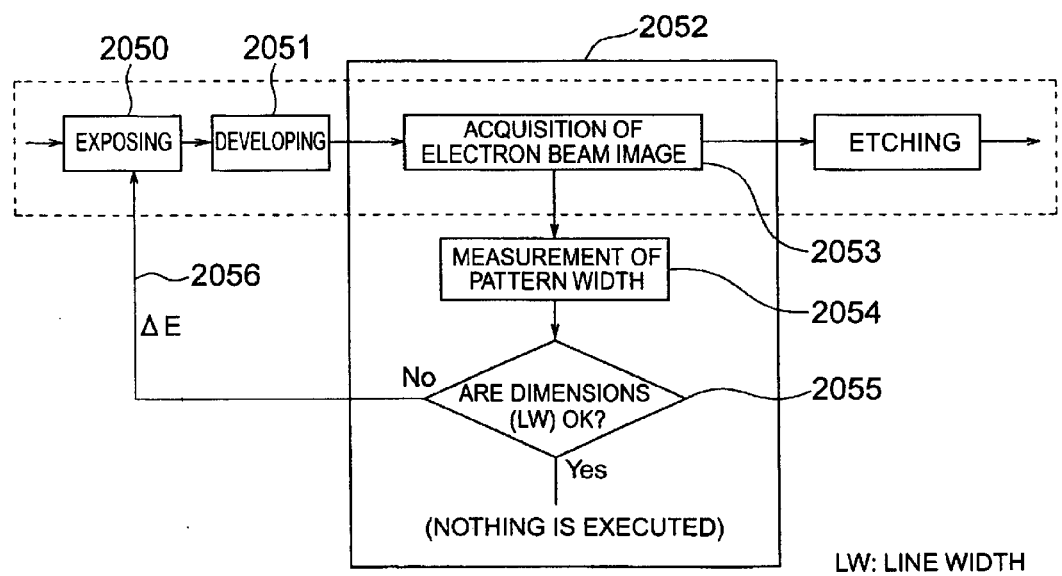
FIG. 2 is a block diagram showing a conventional lithography process.
Figure 3:
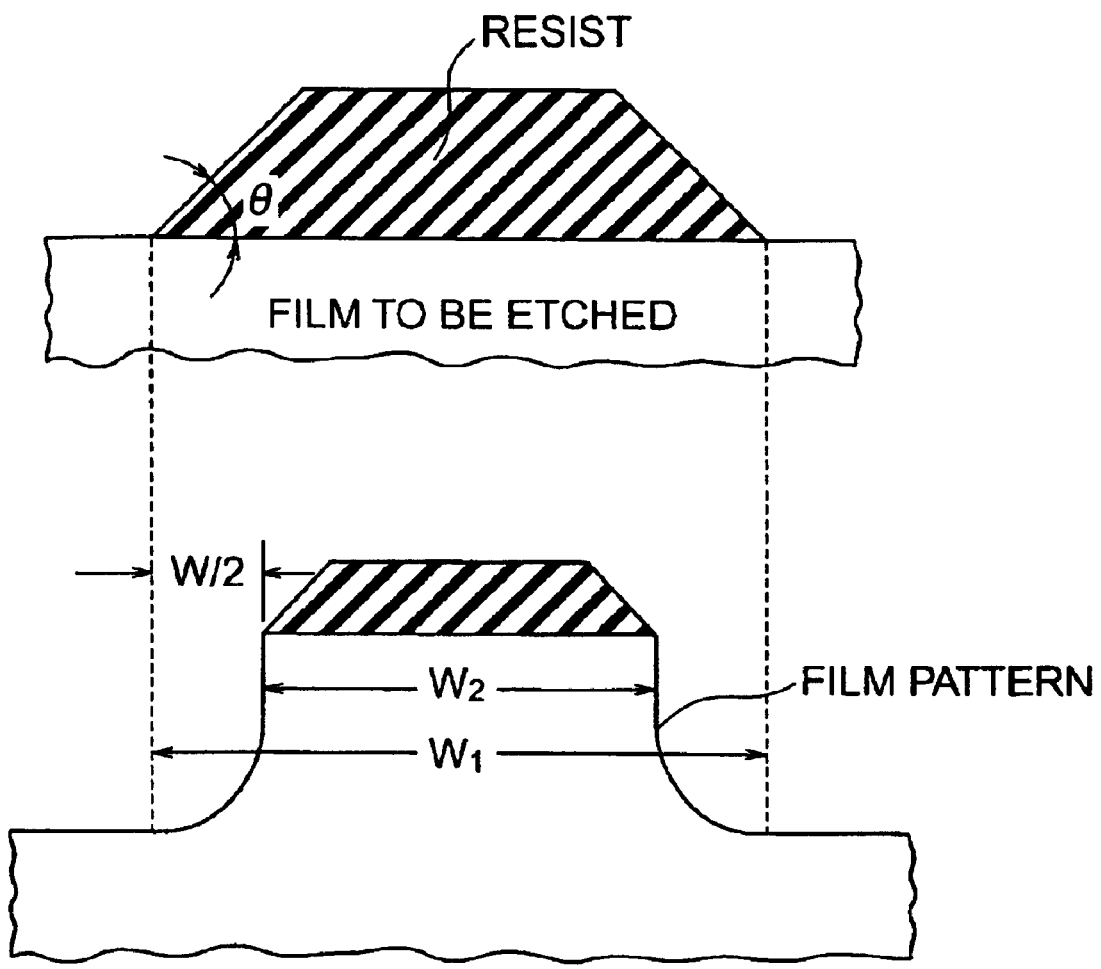
FIG. 3 is a cross section of a resist pattern and a film pattern showing a relation between a resist pattern shape and a film pattern shape.

FIG. 1 is a conceptual diagram of a lithography process which includes exposure process monitoring according to a first embodiment of the present invention. In the drawing, a part (1000) surrounded with a broken line shows a flow of a product wafer (from left to right), and a part (2000) surrounded with a solid line shows a flow of a process for monitoring an exposure process (from top down).

The monitoring of the exposure process is implemented by timing of conventional dimension checking. Observation data of a resist pattern which has a predetermined pattern shape (described later) is obtained (step 2001), and a feature amount fk of the observation data is calculated (step 2002). A subscript k is a serial number of a feature amount (k=1 . . . n; n is a total number of feature amounts). Then, the feature amount fk is applied to model data Mk (E, F) for correlating exposure conditions (E, F) with the observation data (step 2003), and exposure conditions (E, F) are calculated from a result of application of all feature amounts (step 2004). Here, the model data Mk is created beforehand by using the FEM wafer or the like to collect observation data under various exposure conditions (E, F).

A result of the (E, F) calculation is sent to a semiconductor manufacturing control system such as an APC controller 2005 or the like. Feedback amounts ΔE and ΔF to an exposure tool are decided based on time shifting or the like of fluctuations in an exposure dose and a focal position value, and a recipe of the exposure tool is changed based on the ΔE and the ΔF thereafter. As a result, wafers (lots) are subjected to exposure under better process conditions thereafter. According to the present invention, even if deviation occurs in any one of the focal position and the exposure dose, a fluctuation thereof is quantitatively measured to be fed back to the exposure conditions. Thus, it is possible to maintain a normal exposure process. Hereinafter, the invention will be described in detail.

(2) Observation Target Pattern

As an observation target, a highly isolative pattern such as an isolated line pattern or an isolated island pattern in which no other patterns are present nearby is used. Alternatively, an isolated space pattern or an isolated hole pattern which is an inverted pattern thereof may be used. A pattern size is preferably equal to or lower than an exposure wavelength (e.g., pattern size is 100 to 200 nm if an exposure wavelength is 193 nm).

Figure 4:
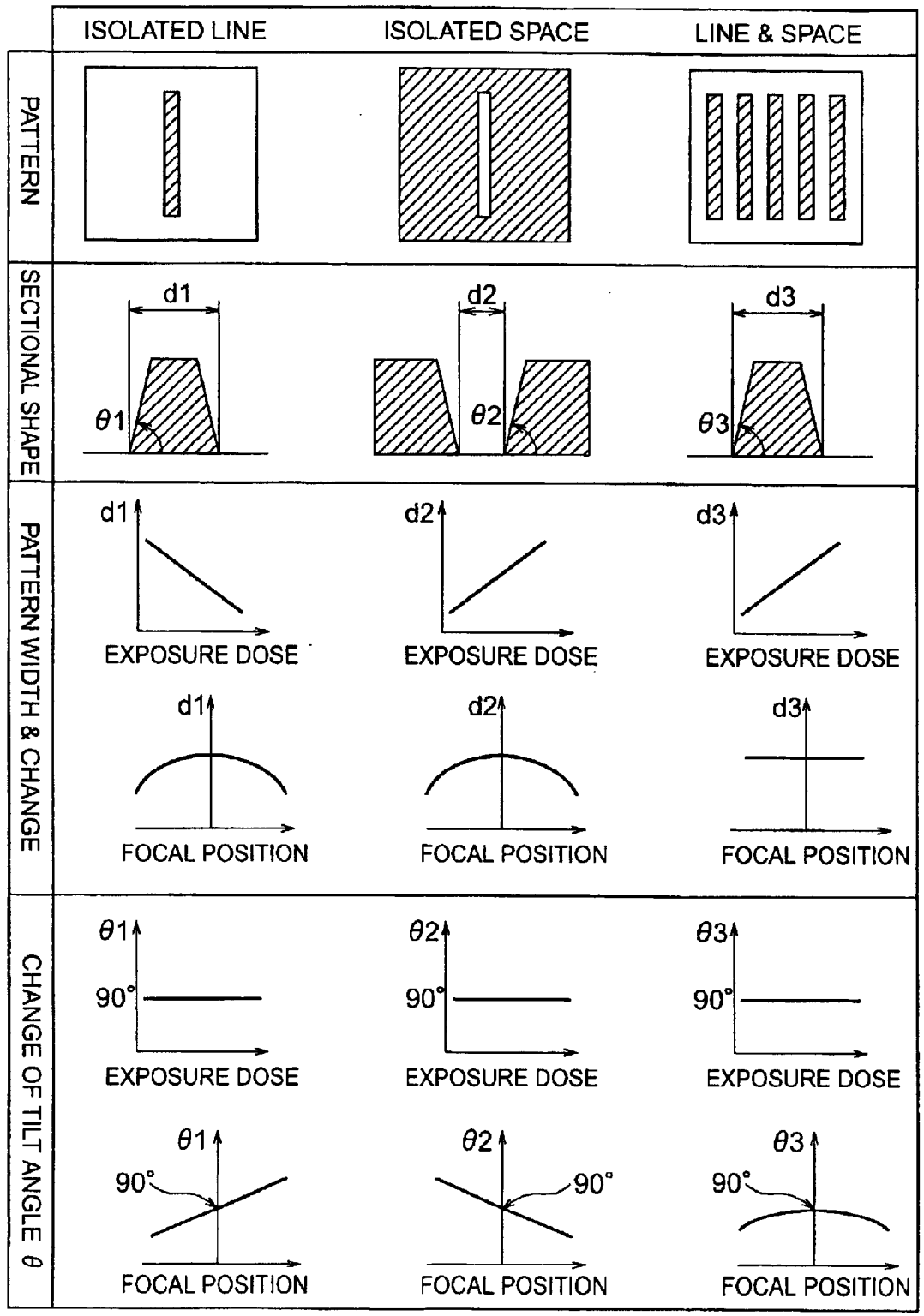
FIG. 4 is a view showing a list of states of shape of cross sections, pattern widths and tilt angles of pattern types.

FIG. 4 schematically shows changes in shape of cross sections of an isolated line pattern, an isolated island pattern, and a line & space pattern in comparison with one another by fluctuations in the exposure dose and the focal position of the exposure tool. For simplification, shape of cross sections are represented by trapezoids, and changes in pattern widths and side wall tilt angles by the exposure dose and the focal position are represented by graphs.

If a fluctuation occurs in the exposure dose, since all the patterns are changed by pattern widths d, the pattern widths can be used as barometers of exposure dose fluctuations. If a fluctuation occurs in the focal position, however, a change in the shape of cross section of the line & space pattern is not so great while the shapes of the isolated line pattern and the isolated space pattern are greatly changed (pattern widths and side wall tilt angles are changed). Especially when focal position deviation is near 0, almost no changes occur in the pattern width and the side wall tilt angle.

The side wall tilt angle is changed as the focal position deviation is more apart from 0. However, since shape changes are similar between positive and negative sides, a code of focus deviation may be mistaken if such a change is used as a barometer. It is therefore apparent that the highly isolative pattern such as the isolated line pattern or the isolated space pattern is more suited for monitoring the focal position fluctuation.

If the isolated line pattern and the isolated space pattern are compared with each other, the former exhibits a monotonous reduction with respect to the exposure dose fluctuation while the latter exhibits a monotonous increase. This is due to a difference between measurement of a resist width and measurement of a resist space, and there is no substantial difference therebetween. Characteristic points are changes in the side wall tilt angles of both with respect to the focal position fluctuation. In the case of the isolated line pattern, it is formed into a tapered shape ($\theta<90°$) when the focal position is shifted to a negative side, while it is formed into an inverse tapered shape ($\theta>90°$) when the focal position is shifted to a positive side. In the case of the isolated space pattern, it is formed into an inverse tapered shape when the focal position is shifted to the negative side, while it is formed into a tapered shape when the focal position is shifted to the positive side.

Such a behavioral difference is generated because effective light intensity varies depending on a pattern size and pattern arrangement (effective light intensity is isolated line pattern>line & space pattern>isolated space pattern), and it is an appearance of an optical proximity effect in a broad sense. Next, description will be made of acquisition of an exposure dose fluctuation amount and a focal position fluctuation amount by setting the highly isolative pattern such as the isolated line pattern or the isolated space pattern as an observation target.

(3) Observation Method 1

According to the first observation method, a feature amount calculated from an electron beam image of a resist pattern by electron microscopy which enables tilt observation is set as observation data. Each of FIGS. 5A to 5E shows changes in values of an electron beam image obtained in the case of no tilt observation, i.e., by applying an electron beam to the resist pattern vertically from above, and detecting a generated secondary electron (referred to as top-down view image, hereinafter), and a feature amount calculated from the top-down view image with respect to an exposure amount fluctuation and a focal position fluctuation.

Figure 5A:
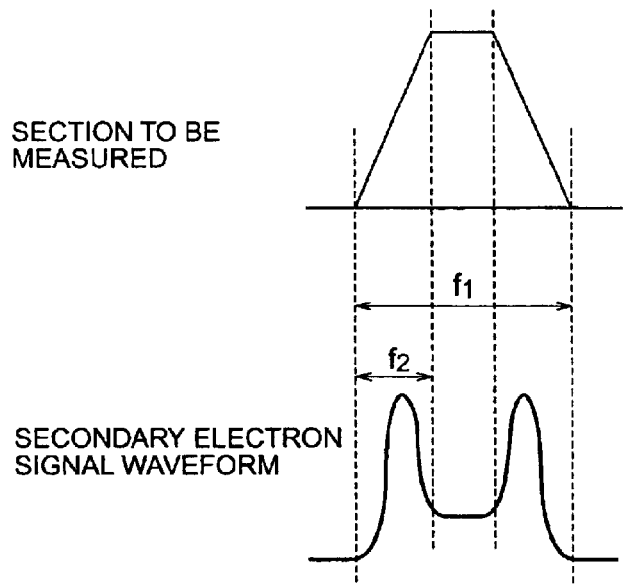
FIG. 5A is a view showing a relation between a shape of cross section and a secondary electron signal waveform of an isolated line pattern.

FIG. 5A shows a relation between a shape of cross section and secondary electron signal intensity of an isolated line pattern. In this example, as shown, the isolated line pattern is an observation target. Generally, since the secondary electron signal intensity is increased in accordance with a tilt angle, signal intensity of a side wall part is larger than that of a flat part.

Since it appears as a bright band on the electron beam image, the pattern may be referred to as a white band or a bright band. FIGS. 5B to 5E show changes of a feature amount f1: pattern width and a feature amount f2: white band width by a focal position fluctuation or an exposure dose fluctuation. The f1 roughly reflects a change of a pattern width d1 shown in FIG. 4, and the f2 roughly reflects a change of a side wall tilt angle $\theta 1$. The f2 is not changed if the $\theta 1$ is 90° or higher. This is attributed to the fact that no change appears on a top-down view image in an inverse tapered shape.

Figure 6A:
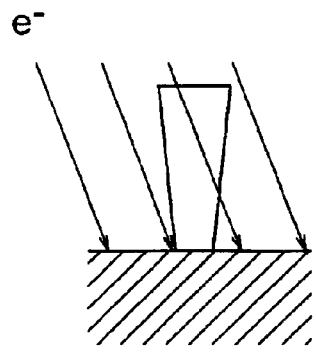
FIGS. 6A and 6B are views showing patterns, substrate sections, and electron and beam incident directions during tilt imaging.
Figure 6B:
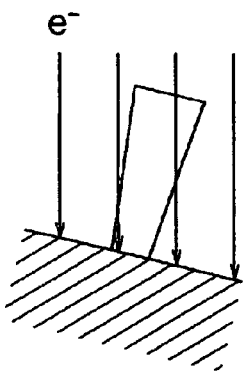
Figure 6C:
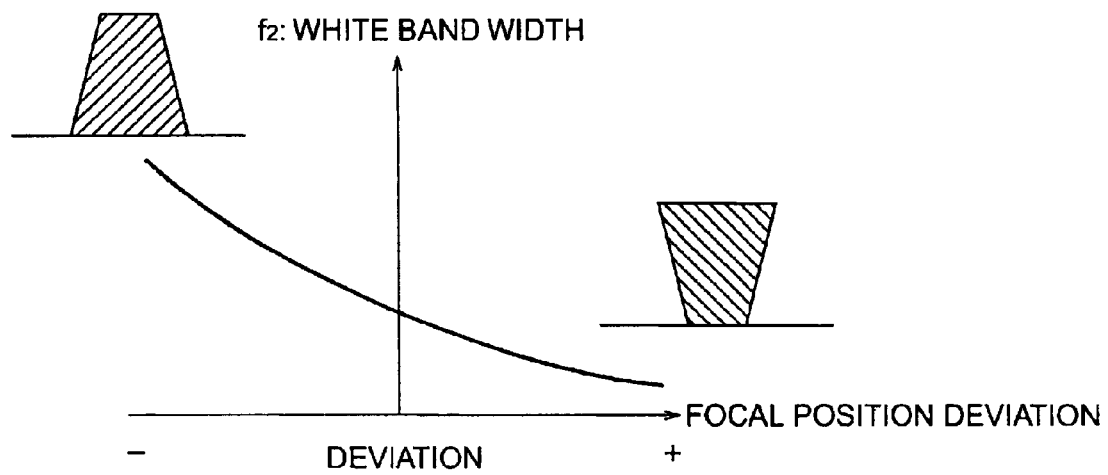
FIG. 6C is a graph showing a relation between the white band width and the focus deviation amount.

According to the first observation method of the present invention, to solve the aforementioned problem, a feature amount is calculated from a tilt image by using the electron microscopy which enables tilt observation. For tilt imaging, an electron beam to be scanned may be tilted as shown in FIG. 6A, or a stage may be tilted as shown in FIG. 6B. A change of an inverse tapered shape also appears on the tilt image. Thus, as shown in FIG. 6C, a change of the focal position from a negative side to a positive side is accompanied by a continuous change in the white band width f2. As a result, it is possible to use the white band width f2 as a barometer of the focal position fluctuation.

As the feature amount, not only the pattern width f1 and the white band width f2 but also shape of cross section information contained in the image is all used. Thus, various feature amounts similar to those shown in FIG. 7A may be used. Alternatively, in place of the feature amount calculated from the signal waveform, a signal waveform g(x) similar to that shown in FIG. 7B may be used as a feature amount, or an electron beam image h(x, y) similar to that shown in FIG. 7C may be used as a feature amount.

When an image is obtained, to reduce an influence of a variance in the feature amount caused by line edge roughness of the resist pattern, in place of a normal image of equal length and breadth magnification, an image of variable length and breadth magnification in which a scanning space of an electron beam is expanded in a line longitudinal direction may be used as shown in FIG. 7B. To reduce an influence of topography in one shot, electron beam images of the resist pattern are preferably obtained at a plurality of places in one shot. The pattern may be a dedicated pattern disposed in a scribing area or the like, or a real pattern may be used.

The case of using the isolated line pattern has been described. The same applies to the case of using the isolated space pattern or other highly isolative patterns.

(4) Details on Method of Calculating Exposure Dose and Focal Position

Each of FIGS. 8A to 8C shows a process of model creation. As shown, an FEM wafer is used to obtain an image at each exposure dose and each focus value (E, F), and feature amounts similar to those of FIG. 7A are calculated (only two feature amounts are shown for simplification). This is set as mk (E, F) (k=1 ... n; n is a total number of feature amounts). Mk (E, F) in which the mk is smoothed and interpolated is set as model data. The interpolation is carried out for the purpose of calculating an exposure dose and a focal position at resolution finer than that for the FEM exposure dose and the space of the focal position. Each of FIGS. 9A to 9C shows a process of calculating an exposure dose and a focal position.

A feature amount fk (k=1 ... n) is calculated from an SEM image of a resist pattern of a wafer to be estimated for an exposure dose/focal position. Assuming that a variance in the feature amount fk complies with a normal distribution of standard deviation, a likelihood function pk (E, F) (k=1 ... n) shown in an equation 1 is obtained.

$$p_k(E, F) = \frac{1}{\sqrt{2\pi}} \exp\left\{\frac{(f_k - M_k(E, F))^2}{2\sigma_k}\right\} \quad \text{(Equation 1)}$$

σk is given a value which matches a real situation of a process variance. Subsequently, likelihood functions of feature amounts are multiplied to obtain P (E, F) (equation 2), and (E, F) of a maximum value thereof is set as a solution to estimation of an exposure dose and a focus value (equation 3).

$$P(E,F) = p_1(E,F) \times p_2(E,F) \ldots \times p_n(E,F) \quad \text{(Equation 2)}$$

$$(E, F) = \left\{(E_i, F_j) | P(E_i, F_j) = \max_{e,f} P(e, f)\right\} \quad \text{(Equation 3)}$$

The same holds true when a signal waveform g(x) and an electron beam image h(x, y) are feature amounts as shown in FIGS. 7A and 7B. That is, a position coordinate x, or (x, y) is treated as in the case of the k, and the same calculation process is applied.

(5) Observation Method 2

According to a second observation method, a feature amount calculated from an electron beam of a resist pattern imaged under imaging conditions for generating asymmetry on a signal waveform in accordance with a shape of cross section thereof is used as observation data.

Figure 10:
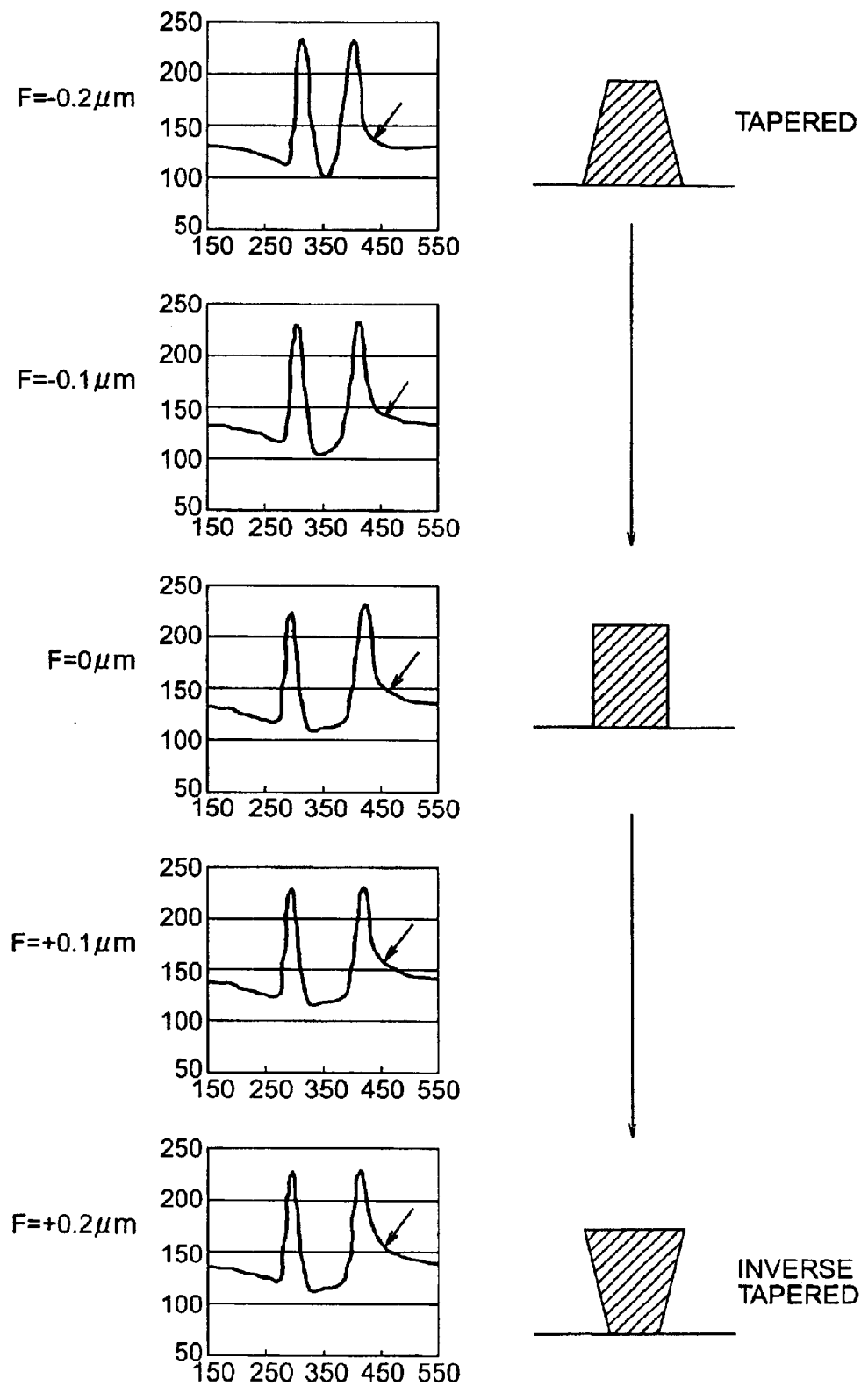
FIG. 10 is a view showing a change in a signal waveform which accompanies a fluctuation in a focal position in a second observation method.
Figure 11A:
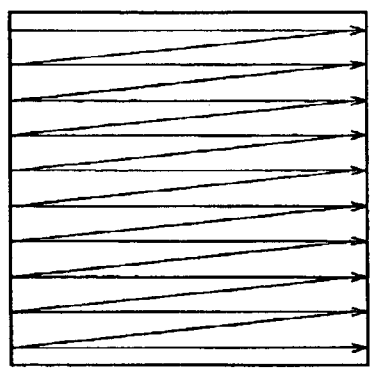
FIG. 11A is a view illustrating the second observation method.

FIG. 10 shows a signal waveform of an image obtained by scanning a resist pattern in which a focal position of an exposure tool is different from left to right in one direction on an image by an acceleration voltage of 800 V and a beam current of 8 pA (see FIG. 11A). A pattern is an isolated line pattern. As described above, the pattern is formed into a tapered shape if the focal position of the exposure tool is shifted to a negative side, and it is formed into an inverse tapered shape if the position is shifted to a positive side. Focusing on a part of an arrow mark on the signal waveform, it can be understood that as a degree of inverse tapering increases, a signal amount of an outer sleeve part of a right white band is increased.

Figure 5B:
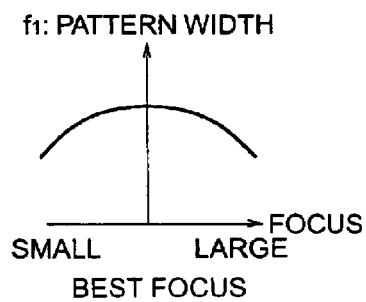
FIG. 5B is a graph showing a relation between a pattern width and a focus deviation amount.
Figure 5C:
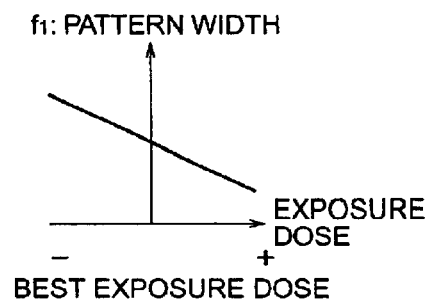
FIG. 5C is a graph showing a relation between the pattern width and a fluctuation amount of an exposure dose.
Figure 5D:
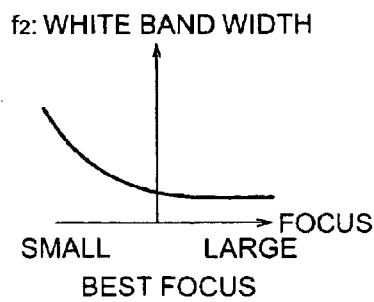
FIG. 5D is a graph showing a relation between a white band width and a focus deviation amount.
Figure 5E:
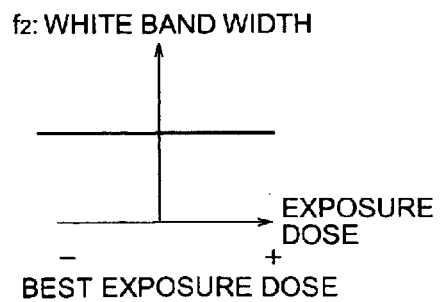
FIG. 5E is a graph showing a relation between the white band width and the fluctuation amount of the exposure dose.

In the case of a normal top-down view image, no shape of cross section change appears on the electron beam image when the resist becomes an inverse tapered shape (see FIG. 5B). However, by employing the aforementioned image acquisition method, it is possible to detect a change of the inverse tapered shape.

Figure 11B:
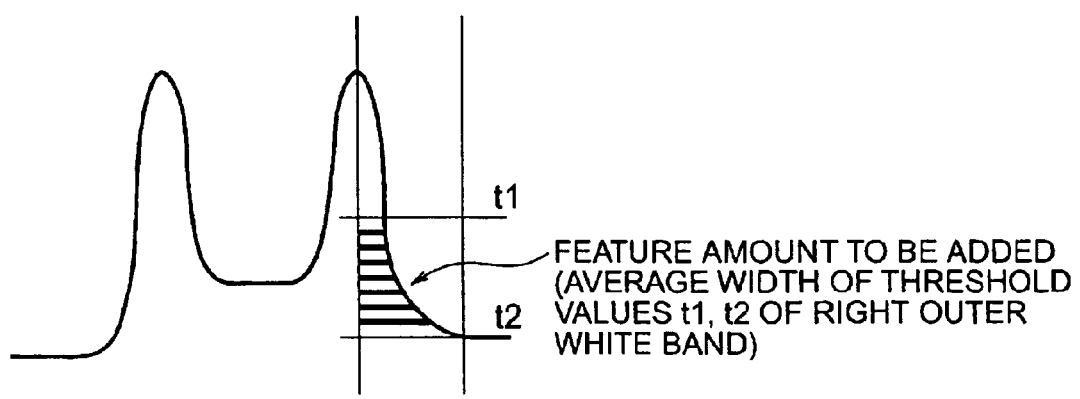
FIG. 11B is a view showing a method of calculating a feature amount in the second observation method.

As the feature amount, for example, a feature amount similar to that shown in FIG. 11B is used. Image acquisition conditions are not limited to the aforementioned conditions (acceleration voltage of 800 V, beam current of 8 pA, one-direction scanning). Optional imaging conditions may be applied so that a shape of cross section change of an object from a tapered shape to an inverse tapered shape can appear on the electron beam image.

(6) Observation Method 3

Figure 12:
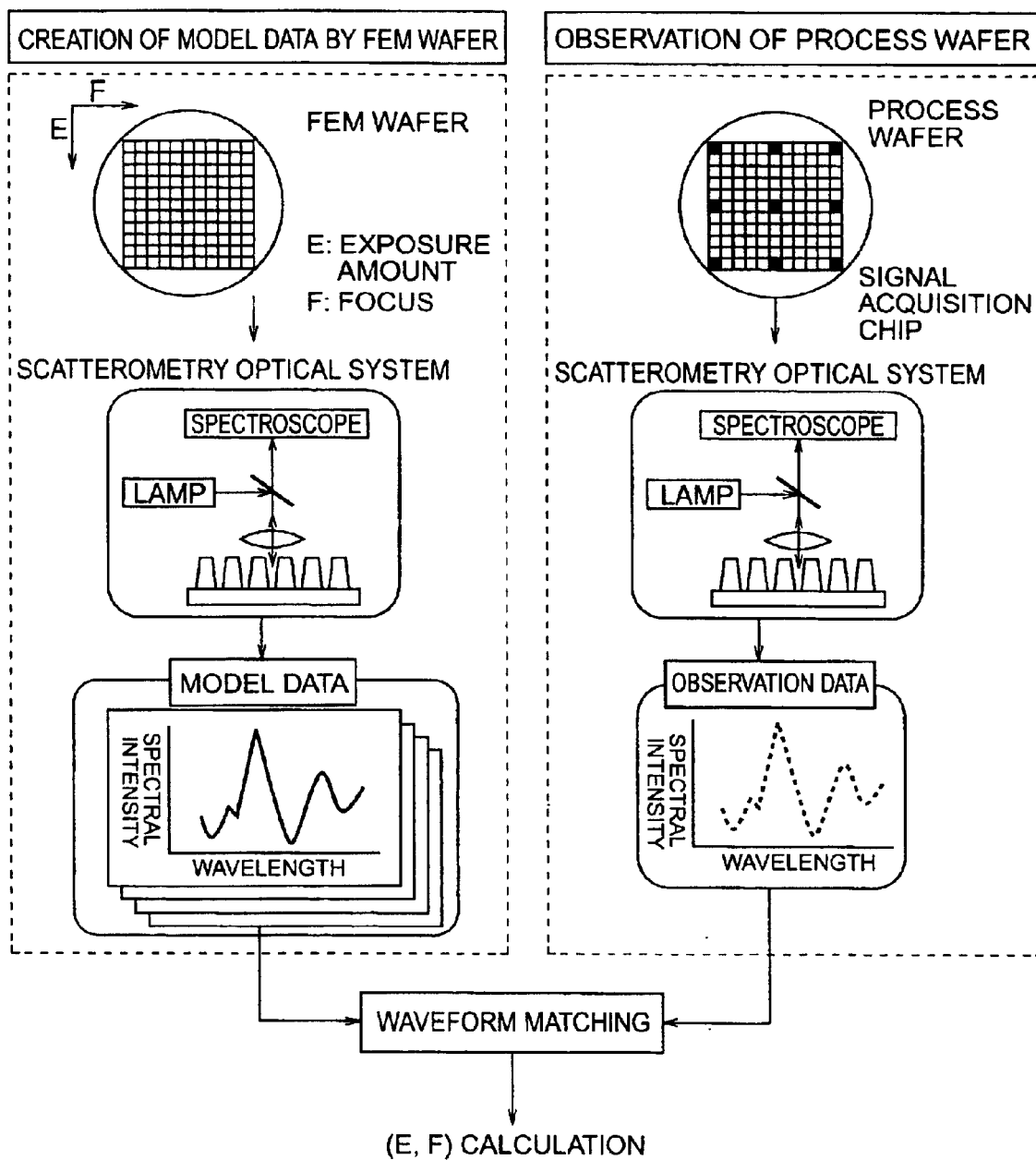
FIG. 12 is a flowchart showing an overall flow of a third observation method.

A third observation method is shown in FIG. 12. Here, as observation means, an optical measurement system (scatterometry) for detecting a scattered light from a resist pattern is used as an observation device, and scattering characteristic data is used as observation data. To obtain scattering characteristic data of fixed accuracy, a line & space pattern formed at a constant pitch in a visual field is necessary.

Figure 13A:
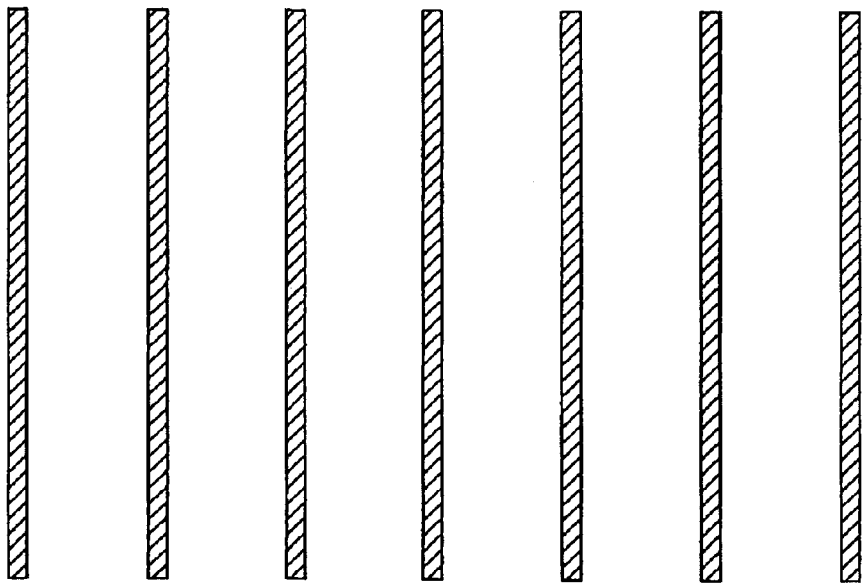
FIGS. 13A and 13B are plan views of observation target patterns used for the third observation method.
Figure 13B:
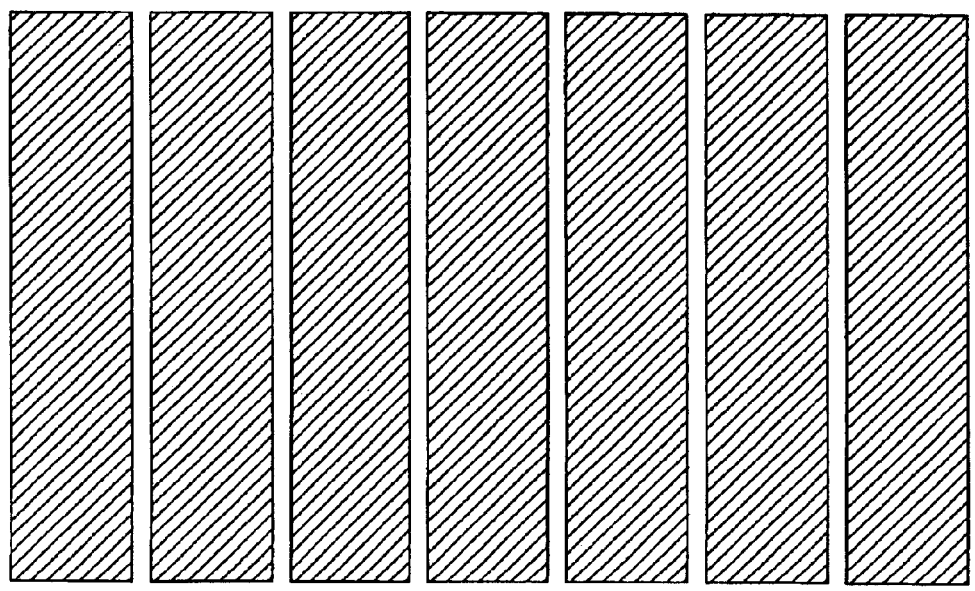

However, as shown in FIG. 4, a shape of cross section change is not so great with respect to a focal position fluctuation in the case of the normal line & space pattern. Thus, a line & space pattern of a line width<<a space width similar to that shown in FIG. 13A, or a line & space pattern of a line width>>a space width similar to that shown in FIG. 13B is used as an observation target. The former exhibits a behavior similar to that of the isolated line pattern, and the latter exhibits a behavior similar to that of the isolated space.

As shown in FIG. 12, deviation amounts of an exposure dose and a focal position are calculated by using a scattering characteristic data group actually measured from an FEM wafer as model data, and collating actually measured scattering characteristic data of a process wafer by the same optical measurement system with the model data. For the collation, a normalization correlation is obtained between the scattering characteristic data, and an exposure dose and a focal position (E0, F0) of model data of a largest correlation coefficient are set as solutions. Alternatively, a correlation coefficient near 8 around (E0, F0) may be obtained and, by applying a paraboloid, a peak position of the correlation coefficient may be calculated at resolution finer than that for the FEM exposure amount and the focal position space.

In the drawing, the scattering characteristic data is a waveform VS spectral intensity. However, other scattering characteristic data such as phase information may be used. Additionally, any one of the patterns of FIGS. 13A and 13B may be used as an observation target, or both may be used as observation targets. Throughput may become ½, but higher accuracy can be expected. According to the present invention, it is possible to detect not only the exposure dose fluctuation but also the focal position fluctuation, and moreover to obtain accurate fluctuation amounts of the exposure dose and the focal position. As a result, it is possible to detect a three-dimensional shape abnormality caused by deviation of the focal position which has been overlooked in the conventional dimension measurement, and to prevent generation of a defect which becomes a nonreproducible film pattern after etching.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of monitoring an exposure process comprising:

a first step of observing, through electron microscopy, a resist pattern formed by exposure under various conditions in which an exposure dose and a focal position are changed to obtain observation data of the resist pattern;

a second step of creating model data for correlating the exposure conditions with the observation data by use of the observation data obtained by observing the resist pattern obtained in the first step through the electron microscopy;

a third step of observing, through the electron microscopy, a resist pattern formed through the exposure process to be monitored to obtain observation data; and a fourth step of collating the observation data obtained in the third step with the model data created in the second step to estimate a deviation amount of the exposure process to be monitored from proper conditions, wherein the resist pattern formed by the exposure under various conditions in which the exposure dose and the focal position are changed is a resist pattern changed in dimensions and in a shape of cross section from a tapered profile to an inverse tapered profile by a fluctuation in the exposure conditions.

2. The method according to claim 1, wherein the resist pattern is a highly isolative left pattern formed by leaving a resist in a convex shape, and/or a highly isolative removed pattern formed by removing the resist in a concave shape.

3. A method of monitoring an exposure process comprising:

a first step of observing, through electron microscopy, a resist pattern formed by exposure under various conditions in which an exposure dose and a focal position are changed to obtain observation data of the resist pattern;

a second step of creating model data for correlating the exposure conditions with the observation data by use of the observation data obtained by observing the resist pattern obtained in the first step through the electron microscopy;

a third step of observing through the electron microscopy, a resist pattern formed through the exposure process to be monitored to obtain observation data; and a fourth step of collating the observation data obtained in the third step with the model data created in the second step to estimate a deviation amount of the exposure process to be monitored from proper conditions, wherein the electron microscopy enables tilt imaging, and the observation data obtained in the first and third steps are electron beam images of resist patterns obtained by using the electron microscopy to execute the tilt imaging.

4. A method monitoring an exposure process comprising:

a first step of observing, through electron microscopy, a resist pattern formed by exposure under various conditions in which an exposure dose and a focal position are changed to obtain observation data of the resist pattern;

a second step of creating model data for correlating the exposure conditions with the observation data by use of the observation data obtained by observing the resist pattern obtained in the first step through the electron microscopy;

a third step of observing, through the electron microscopy, a resist pattern formed through the exposure process to be monitored to obtain observation data; and a fourth step of collating the observation data obtained in the third step with the model data created in the second step to estimate a deviation amount of the exposure process to be monitored from proper conditions, wherein the electron microscopy enables tilt imaging, and the observation data used in the second and fourth steps are dimension feature amounts which contain edge widths and/or pattern widths of electron beam images of resist patterns obtained by using the electron microscopy to execute the tilt imaging.

5. The method according to claim 1, further comprising:

a step of obtaining a correction amount of the exposure conditions based on a result of estimating the deviation amount of the exposure process to be monitored from the proper conditions.

6. A method of monitoring an exposure process, comprising:

a first step of obtaining observation data of a resist pattern under various exposure conditions in which an exposure dose and a focal position are changed;

a second step of creating model data for correlating the exposure conditions with the observation data by using the observation data obtained in the first step;

a third step of obtaining observation data of a resist pattern formed through the exposure process to be monitored; and a fourth step of collating the observation data of the resist pattern with the model data to estimate a deviation amount of the exposure process to be monitored from proper conditions, wherein a resist pattern changed in dimensions and in a shape of cross section from a tapered profile to an inverse tapered profile by a fluctuation in the exposure conditions is observed, electron microscopy which enables tilt imaging is used as observation means in the first and third steps, and electron beam images and/or dimension feature amounts which contain edge widths and/or pattern widths of electron beam images of resist patterns obtained by using the electron microscopy to execute the tilt imaging are used as the observation data in the second and fourth steps.

7. The method according to claim 6, wherein as the resist pattern changed in the dimensions and in the shape of cross section from the tapered profile to the inverse tapered profile by the fluctuation in the exposure conditions, a highly isolative left pattern formed by leaving a resist in a convex shape or a highly isolative removed pattern formed by removing the resist in a concave shape is used.

8. The method according to claim 6, further comprising:

a step of obtaining a correction amount of the exposure conditions based on a result of estimating the deviation amount of the exposure process to be monitored from the proper conditions.

9. A method of monitoring an exposure process, comprising:

a first step of using, as an observation target, a resist pattern under various exposure conditions in which an exposure dose and a focal position are changed to obtain observation data of the observation target;

a second step of creating model data for correlating the exposure conditions with the observation data by using the observation data obtained in the first step;

a third step of obtaining observation data of a resist pattern formed through the exposure process to be monitored; and a fourth step of collating the observation data of the resist pattern with the model data to estimate a deviation amount of the exposure process to be monitored from proper conditions, wherein the observation target is a resist pattern changed in dimensions and in a shape of cross section from a tapered profile to an inverse tapered profile by a fluctuation in the exposure conditions, electron microscopy which enables tilt imaging is used as observation means in the first and third steps, and electron beam images and/or dimension feature amounts which contain edge widths and/or pattern widths of electron beam images of resist patterns imaged under imaging conditions for generating asymmetry on a signal waveform in accordance with a shape of cross section of the resist pattern are used as the observation data in the second and fourth steps.

10. The method according to claim 9, wherein as the resist pattern changed in the dimensions and in the shape of cross section from the tapered profile to the inverse tapered profile by the fluctuation in the exposure conditions, a highly isolative left pattern formed by leaving a resist in a convex shape or a highly isolative removed pattern formed by removing the resist in a concave shape is used.

11. The method according to claim 9, further comprising:

a step of obtaining a correction amount of the exposure conditions based on a result of estimating the deviation amount of the exposure process to be monitored from the proper conditions.

12. A method of monitoring an exposure process, comprising:

a first step of obtaining observation data of a resist pattern under various exposure conditions in which an exposure dose and a focal position are changed;

a second step of creating model data for correlating the exposure conditions with the observation data by using the observation data obtained in the first step;

a third step of obtaining observation data of a resist pattern formed through the exposure process to be monitored; and a fourth step of collating the observation data of the resist pattern with the model data to estimate a deviation amount of the exposure process to be monitored from proper conditions, wherein an observation target is a resist pattern changed in dimensions and in a shape of cross section from a tapered profile to an inverse tapered profile by a fluctuation in the exposure conditions, an optical measurement system which detects a scattered light from the resist pattern is used as observation means in the first and third steps, and scattering characteristic data is used as the observation data.

13. The method according to claim 12, wherein as the resist pattern changed in the dimensions and in the shape of cross section from the tapered profile to the inverse tapered profile by the fluctuation in the exposure conditions, a highly isolative left pattern formed by leaving a resist in a convex shape or a highly isolative removed pattern formed by removing the resist in a concave shape is used.

14. The method according to claim 12, wherein as the resist pattern changed in the dimensions and in the shape of cross section from the tapered profile to the inverse tapered profile by the fluctuation in the exposure conditions, (1) a line & space pattern in which a space width is sufficiently larger than a line width, and/or (2) a line & space pattern in which a space width is sufficiently smaller than a line width are used.

15. The method according to claim 12, further comprising:

a step of obtaining a correction amount of the exposure conditions based on a result of estimating the deviation amount of the exposure process to be monitored from the proper conditions.

* * * * *